United States Patent [19]
Fujiwara et al.

[11] 3,986,025
[45] Oct. 12, 1976

[54] ION MICROANALYZER

[75] Inventors: Mitsuo Fujiwara, Katsuta; Hifumi Tamura, Hachioji; Toshio Kondo, Sagamihara, all of Japan

[73] Assignee: Hitachi, Ltd., Japan

[22] Filed: June 7, 1974

[21] Appl. No.: 477,466

[30] Foreign Application Priority Data
June 8, 1973 Japan.................. 48-63803

[52] U.S. Cl.................. 250/306; 250/309
[51] Int. Cl.² .................. H01J 37/26
[58] Field of Search ......... 250/309, 307, 306, 310, 250/311, 396, 397, 398, 399

[56] References Cited
UNITED STATES PATENTS

| | | | |
|---|---|---|---|
| 3,517,191 | 6/1970 | Liebl | 250/309 |
| 3,585,383 | 6/1971 | Castaing | 250/309 |
| 3,686,499 | 8/1972 | Omura | 250/309 |
| 3,840,743 | 10/1974 | Tamura | 250/309 |

OTHER PUBLICATIONS

"Ion Microprobe Mass Analyzer," Liebl, Journal of Applied Physics, vol. 38, No. 13, Dec. '67, pp. 5277-5283.

Primary Examiner—Craig E. Church
Attorney, Agent, or Firm—Craig & Antonelli

[57] ABSTRACT

In an ion microanalyzer wherein the secondary ions emitted from a sample as a result of the bombardment of the sample by a primary ion beam are mass-analyzed and selected in accordance with their mass to electric charge ratios and the selected secondary ions are then detected by a detector, the image of the secondary ions emitted from the sample is formed through the converging action of a modified electrostatic lens on a slit disposed between the mass analyzing means and the detector or in front of the mass analyzing means.

18 Claims, 11 Drawing Figures

ION MICROANALYZER

BACKGROUND OF THE INVENTION

1. Field Of The Invention

The present invention relates to an ion microanalyzer which is so designed as to attain a high utility factor and a high analytic accuracy in the direction of the depth of a sample.

2. Description Of The Prior Art

Recently, there are increasing demands, in the field of material engineering, for the microanalysis of the microscopic domains of a solid sample and for the quantitative analysis of a very thin surface layer and many investigators have developed numerous methods to fulfill such requirements. Their researches are the basic studies to develop new materials and the ion microanalyzer has been invented in this background.

The ion microanalyzer (hereafter referred to as IMA for brevity) is an apparatus in which the secondary ions emitted from a solid sample as a result of the bombardment of the sample by the primary ion beam emitted from an ion source are analyzed by classifying the secondary ions according to their mass to electric charge ratios with a mass spectrometer.

The function of the ion microanalyzer is analogous to that of the electron probe microanalyzer (EPMA). Namely, and EPMA with its electron beam and X-ray analyzing section replaced respectively by an ion beam and a mass spectrometer can function as IMA. The IMA has the following features:

1. the treatment of the sample is easy,
2. the distribution of elemental concentration in the direction of the depth of the sample can be measured,
3. light elements can be analyzed,
4. thin films or thin surface layers can be analyzed,
5. much information can be obtained, and
6. the time required to conduct measurements is short.

Of all the features mentioned above, a notable one which cannot be enjoyed by other analyzing apparatuses is the second item, that is, that the analysis of the sample in the direction of the depth thereof is possible. This analysis can be achieved by increasing the degree of sputtering by increasing the current of the primary ions emitted from the ion source. If the density of the current of the primary ions is kept constant, the speed (A/sec.) of the sputtering of the sample becomes constant, so that the distribution of the concentration of a specific element in the direction of the depth of the sample can be measured by measuring the corresponding specific current of the secondary ions.

The conventional IMA, however, is not provided with a means for focussing through lens action the secondary ion beam emitted from the surface of the sample when the primary ion beam hits against the sample and for forming the image of the sputtered portion of the sample by the secondary ions, but is provided only with a path correcting electrostatic lens which serves to turn the secondary ions emitted from the sample into a parallel beam. Therefore, most part of the secondary ions is blocked by, for example, a slit used in the mass analyzing system and only a small part of the total secondary ions emitted from the sample is used as an information signal. Consequently, the utility factor of the secondary ions is poor. Especially, in the case of the analysis of the sample in the direction of the depth thereof which utilizes the information of the secondary ions from an area of the sample smaller than that area of the sample which is bombarded by the primary ions, only the central portion of the secondary ion beam is taken out by blocking the peripheral portion of the secondary ion beam with a slit and detected. As a result of this process, the utility factor of the secondary ions becomes poorer so that the analytic accuracy is degraded due to the influences of noise etc.

SUMMARY OF THE INVENTION

One object of the present invention is to provide an IMA so designed as to improve the resolution and the analytic accuracy.

Another object of the present invention is to provide an IMA so designed as to improve in particular the analytic accuracy in the direction of the depth of a sample.

An additional object of the present invention is to provide an IMA so designed as to improve the utility factor of the secondary ions.

According to one preferred embodiment of an ion microanalyzer of the present invention, the primary ions in the form of a beam irradiates the surface of a sample to emit secondary ions and the secondary ions are converged by means of a modified electrostatic lens so that, when the secondary ions are mass-analyzed and detected, the image of the secondary ions is formed on the slit disposed between the mass analyzing means and the detector.

Other objects, features and advantages of the present invention will be apparent when one reads the following description of the specification in conjunction with the accompanied drawings.

DESCRIPTION OF THE PREFERRED EMBODIMENTS

Figure 1:
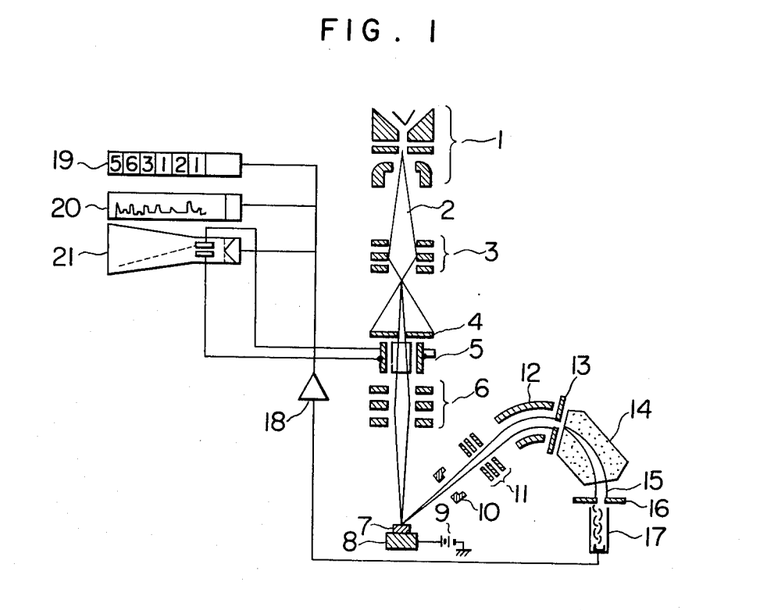
FIG. 1 schematically shows a structure of a conventional ion microanalyzer.

Before the explanation of the present invention itself, the principle and the structure of an IMA will be described and at the same time the problems associated with the IMA will also be mentioned. An IMA consists mainly of a primary ion emission system, a mass analysis system and a display system for observing samples. FIG. 1 is a schematic structure of a conventional IMA.

In FIG. 1, an ion gun 1 emits a primary ion beam 2, which is converged by a condenser lens 3 and impinges through an aperture diaphragm 4 and an objective lens 6 upon a sample 7 placed on a sample stage 8. Deflecting electrodes 5 serve to scan the surface of the sample 7 with the primary ion beam 2 in the two-dimensional fashion. The speed of the scanning is synchronous with that of a display device 21 (e.g. picture tube) described later. These parts constitute the primary ion emission system. Next, the secondary ions emitted from the sample 7 due to the bombardment thereof by the primary ion beam 2 are turned into a beam and accelerated by the voltage applied to the sample from a secondary ion accelerating power source 9 and the voltage applied to a drawing-out electrode 10 from a power source (not shown). The secondary ion beam is subjected to a path correction by means of a beam path correcting electrostatic lens 11 and is led into a sector electric field 12. In this sector electric field 12, the selection of the energy levels of the secondary ions is performed. The secondary ion beam, after having passed the sector electric field 12, has its peripheral portion removed by a $\beta$-slit 13 and is then led into a sector magnetic field 14. In this sector magnetic field 14, the secondary ions are dispersed in accordance with their mass to electric charge ratios and then secondary ions 15 of a desired mass to electric charge ratio are led through a c-slit 16 into a secondary ion detector 17, so that the constituent elements of the sample are analyzed there. The above parts form the mass analysis system. Further, the information signal detected by the secondary ion detector 17 is amplified by an amplifier 18 and the amplified signal is fed, if necessary, to a counter 19, a recorder 20 and a display device 21 for secondary ion image observation so that observations and recordings may be done according to the purpose of the experiment. The parts given above make up the display system for observing the surface of the sample.

Although the general description of the structure of an IMA has been given above, the electrostatic lens 11, the sector electric field 12 and the $\beta$-slit 13, which are shown in FIG. 1 and relevant to the present invention, will be described below in further detail.

Figure 2A:
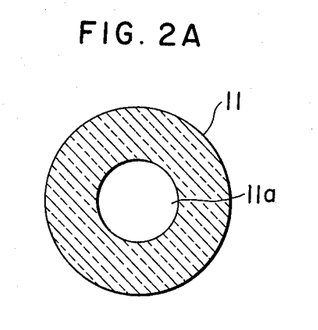
FIGS. 2A and 2B respectively show the shapes of an electrostatic lens and a β-slit used in the conventional analyzer.
Figure 2B:
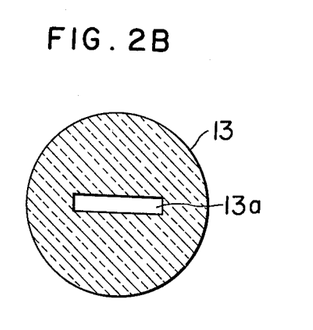

FIG. 2A shows the shape of the electrostatic lens 11 located between the sample 7 and the sector electric field 12. The electrostatic lens 11 serves to correct the path of the secondary ion beam passing through the sector electric field 12 and the $\beta$-slit 13 and has a comparatively large single aperture 13a concentric with the axis so as to prevent the secondary ion beam from being blocked and to improve the utility factor of the secondary electron beam. The secondary electron beam, having passed the electrostatic lens 11, is led into the sector electric field 12. The direction of the sector electric field 12 is parallel to the drawing sheet and the electric field has an effect of converging the ion beam in the vertical direction of the drawings but not in the direction perpendicular to the drawing sheet. Therefore, the secondary ion beam passing through the sector field diverges in the direction perpendicular to the drawing sheet, to have a rectangular cross section with its longer sides perpendicular to the drawing sheet. Accordingly, as shown in FIG. 2B, the $\beta$-slit 13 through which the secondary ion beam passes has an oblong aperture 13a.

As mentioned above, one meritorious feature of the IMA is the capability of analyzing the sample in the direction of the depth thereof. This is due to the use of the sputtering phenomenon which takes place when the sample is bombarded by the primary ion beam. Namely, when the primary ion beam impinges upon the sample, the sample is etched due to sputtering. The speed of the sputtering depends directly upon the ion density of the primary ion beam and if the density is uniform, the sample is etched off uniformly with time in the direction of the depth thereof. Accordingly, if the output of a mass spectrometer is locked to the ions having a certain mass, the distribution of the density of the corresponding element in the direction of the depth of the sample can be known as a function of time. However, according to the conventional techniques several restrictions are set on the improvement in the resolution in the direction of the depth and the resolution is at most several hundreds of Angstroms, so that such a feature as obtained by the IMA proposed by the inventors cannot be enjoyed.

In general, there are two methods of bombarding a sample surface by the primary ion beam. One is called "projection type" and the other "scanning type". According to the projecting type, the primary ion beam is focused to have a spot diameter of about 2 mm and the small-diameter beam continuously impinges upon the sample. In this case, however, there is a considerable drawback in the analysis in the direction of the depth, that the intensity distribution (or ion density distribution) of the primary ion beam over the sample is not uniform but in the Gaussian one. This means that the profile of the etching of the sample is similar to the intensity distribution of the ion beam, that is, the depth of the etching is large at the center of the bombarded area but small in the periphery of the area. This uneven etching is causative of the degradation of the analytic accuracy in the direction of the depth of the sample. In order to improve the analytic accuracy, the aperture 13a of the $\beta$-slit shown in FIG. 2B is reduced so that only a tiny domain of the sample may be subjected to analysis. However, the influence of the distribution of the beam intensity cannot be completely eliminated by such an artifice of reducing the size of the aperture. In addition, if the size of the aperture is reduced, a considerable part of the secondary ion beam is blocked by the $\beta$-slit, and therefore the utility factor of the ion beam becomes very poor.

Figure 3:
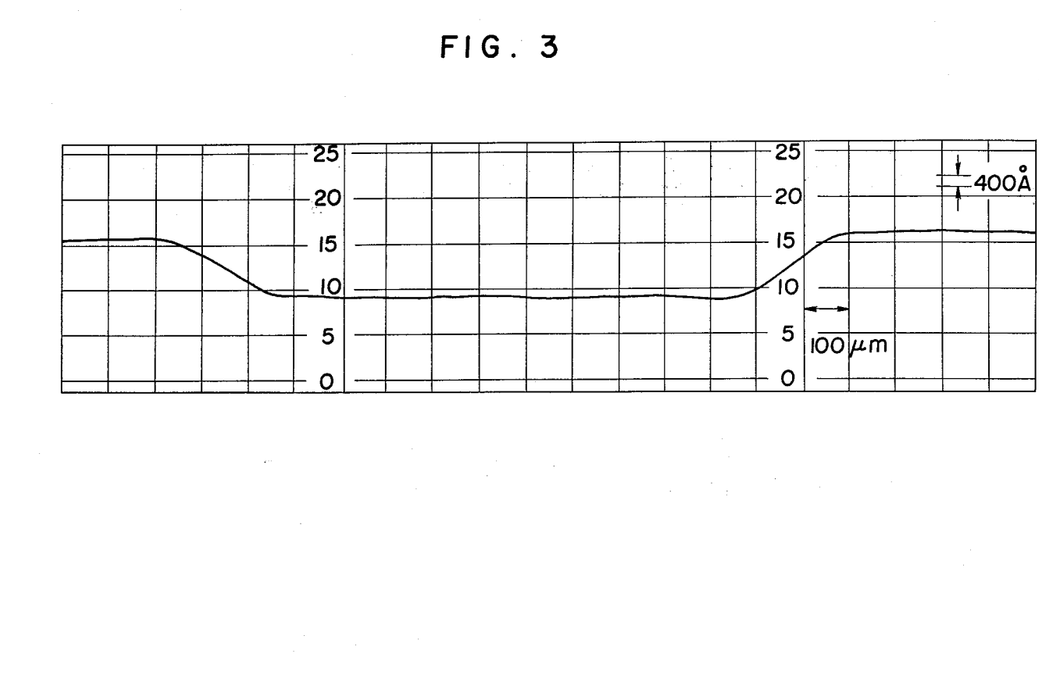
FIG. 3 shows the etching profile of a sample produced through the scanning of the primary ion beam over the sample surface.

On the other hand, according to the scanning type, the spot diameter of the primary ion beam is continuously controlled from 5 to 500 microns and the sample is scanned in the two-dimensional fashion by a beam having a desired spot diameter. In this method, if the speed of scanning by the primary ion beam is constant, the intensity distribution of the primary ion beam over the sample is uniform. Consequently, the analytic accuracy in the direction of the depth can be improved and this is a notable feature. Even in this method, however, there is a drawback that the depth of the etching is not even at the edges of the scanning and the analytic accuracy especially at the marginal portions of the scanned area becomes poor. FIG. 3 shows the etching profile of the sample scanned by the primary ion beam. The profile is the result of the measurement of the surface of the sample by a surface roughness tester. The principle of the tester is as follows. Namely, a probe is moved over the surface of the sample with the point of the probe kept in contact with the surface, and the tiny protuberances and depressions in the surface are detected as the variation in electrostatic capacitance and after amplification of the detected signal is made the record of the profile as seen in FIG. 3. As seen from FIG. 3, there exist etching slopes at the margins of the area scanned by the primary ion beam.

As described above, the IMA makes possible the analysis of a sample in the direction of the depth thereof, by utilizing the sputtering phenomenon caused by the primary ion beam impinging upon the specimen, but for the reasons described above the conventional IMA could not attain a satisfactory analytic accuracy. The present invention has been made just to solve this problem and the principle will be described with the aid of FIG. 4 which illustrates the schematic structure of an IMA according to the present invention. Every part of the structure in FIG. 4 and its principle of operation are the same as the corresponding one of the structure in FIG. 1 and the associated principle of operation so that the explanation will be given only to the inventive matters. Here, the same reference numerals are applied to indicate like parts and elements as in FIG. 1.

The difference of the FIG. 4 structure from the FIG. 1 structure is as follows. The electrostatic lens 11 in front of the sector electric field 12 is replaced by a modified electrostatic lens 11' which has an effect of converging the secondary ion beam in the direction perpendicular to the drawing sheet. Through the converging action of the modified electrostatic lens 11', the image of the secondary ions from the sample is formed on a β-slit 13' having a new aperture. The original purpose of the electrostatic lens is to make parallel the secondary ion beam emitted from the surface of the sample before it enters the sector electric field 12, but in the present invention the conventional electrostatic lens as described above is replaced by a modified electrostatic lens which has an action of converging the secondary ion beam at right angles to the direction of convergence of the secondary ion beam by the sector electric field, that is, perpendicular to the drawing sheet of FIG. 4 and the secondary ions are imaged on the β-slit 13' through the converging effect of the modified electrostatic lens. Here, a power source to apply a voltage to the modified electrostatic lens 11' is not shown.

Figure 5A:
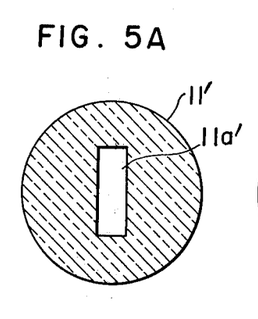
FIGS. 5A and 5B respectively show the shapes of a modified electrostatic lens and a β-slit according to the present invention.
Figure 5B:
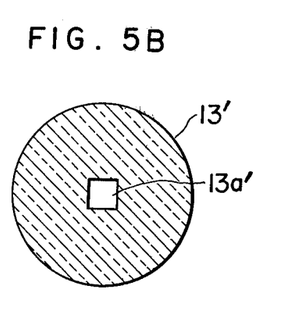

In order to have such a function as described above, the modified electrostatic lens 11' should preferably be provided with an oblong aperture 11'a as shown in FIG. 5A. The reason of this is as follows. Namely, the action of converging the secondary ion beam by the sector electric field exists in the longitudinal direction of the oblong aperture 11'a of the modified electrostatic lens 11' mounted in place in the IMA so that the ratio of the long side to the short one is made large to improve the utility factor of the secondary ions. Moreover, the modified electrostatic lens has no converging action in the longitudinal direction of the oblong aperture located properly. The dimension in the transverse direction of the oblong aperture of the modified electrostatic lens is made small so as to reduce through the aperture the width of the secondary ion beam in the transverse direction since the sector electric field has no action of converging the secondary ion beam in the transverse direction and so as to form the image of the secondary ions on the β-slit. Consequently, there is no need for an oblong β-slit as shown in FIG. 2B but in this case the shape of the β-slit may be of regular polygon or circular (FIG. 5B shows a square β-slit in a special example.).

As described above, if the secondary ions emitted from the central portion of the sample bombarded by the primary ions are detected by controlling the dimensions and the location of the β-slit, the utility factor of the secondary ions can be remarkably improved since the secondary ions are converged by the modified electrostatic lens and focused on the β-slit.

The same description as given above to the projection type IMA can also be applied to the scanning type IMA. In this case, the beam spot on the surface of the sample has, during scanning, a position corresponding to a point of the ion image formed in the β-slit. Accordingly, if a slit having an aperture smaller than the scanned area of the β-slit is inserted in the position of the β-slit, the secondary ion beam only from the central portion of the scanned area of the sample is taken out. Since the density of the secondary ions in the beam is now very high, the analysis in the direction of the depth can be performed with high accuracy.

The above procedure can be easily realized by so controlling, for example, the voltage at the electrode of the modified electrostatic lens that the image of the secondary ions may be formed at the position where the β-slit is located. The same effect can be obtained by so setting the focal point of the modified electrostatic lens 11' at the position of the c-slit 16 in FIG. 4 that the secondary ion image of the sample may be formed on the c-slit. Therefore, this constitution can be regarded as one of the variations of the present invention. In this case, the β-slit 13' is removed or replaced by a slit having a large fixed aperture and the c-slit 16 is provided with the same aperture (of regular polygon or circle) as that (indicated at 13'a in FIG. 5B) of the β-slit 13'. Also, in this case, since the secondary ion image of the sample is formed on the c-slit 16, the voltage at the electrode of the modified electrostatic lens 11' should be readjusted.

The above description is given exclusively to the IMA using a double-focusing mass spectrometer, but the following lines will be concerned with an embodiment of the application of the present invention where a single-focusing mass spectrometer is used.

Figure 6:
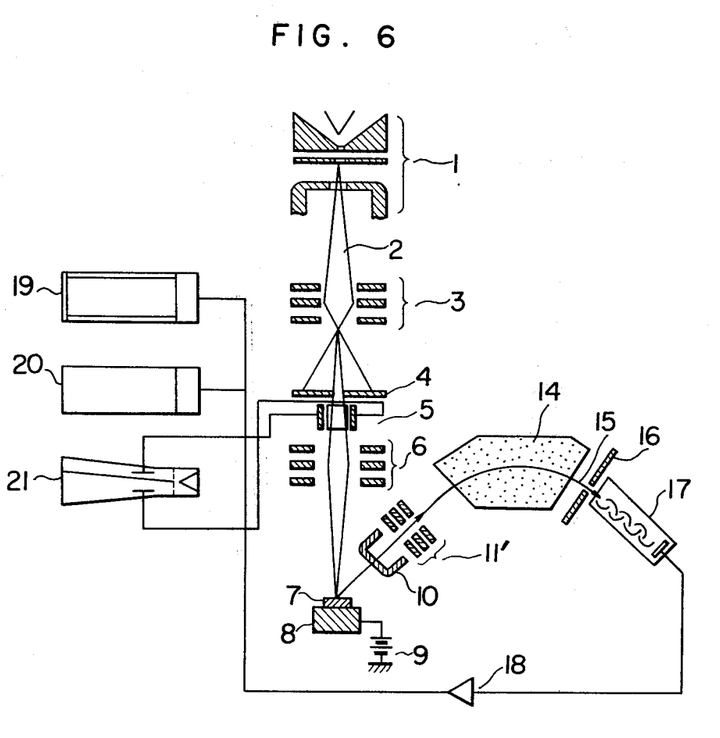
FIG. 6 shows schematically the structure of an ion microanalyzer as a modified embodiment of the present invention.

FIG. 6 shows a schematic structure of an IMA using a single-focusing mass spectrometer, according to the present invention. The structure and the operation of the apparatus shown in FIG. 6 are almost the same as those of the analyzer shown in FIG. 1 or 4 and only different points will be mentioned below. The single-focusing mass spectrometer is equivalent in structure to the double-focusing mass spectrometer minus the sector electric field and the β-slit. As seen in FIG. 6, there are only a modified electrostatic lens 11'(in place of an electrostatic lens 11) and a sector magnetic field 14 between the drawing-out electrode 10 and the c-slit 16. The secondary ion beam, after having passed the modified lens 11', is converged in the direction perpendicular to the drawing sheet and then converged in the direction at right angles to the perpendicular direction to the drawing sheet in the sector magnetic field 14 so that the secondary ion image is formed on the c-slit 16. Thus, the function of the single-focusing mass spectrometer is quite the same as that of the double-focusing one described previously.

Figure 4:
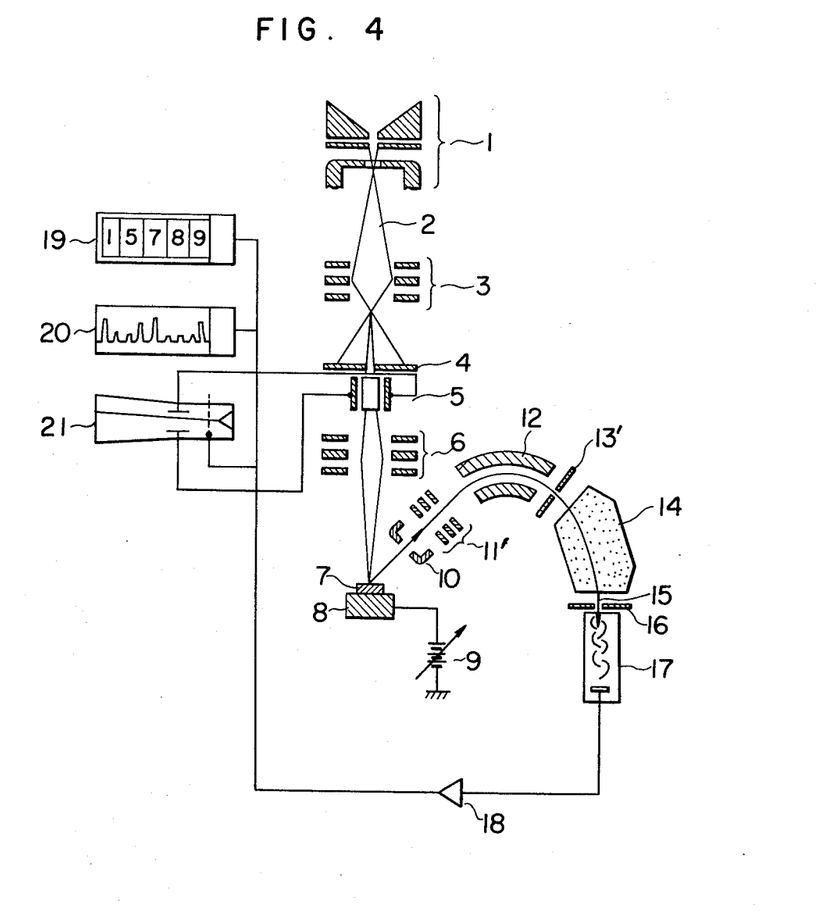
FIG. 4 schematically shows a structure of an ion microanalyzer according to the present invention.
Figures 7A, 7B:
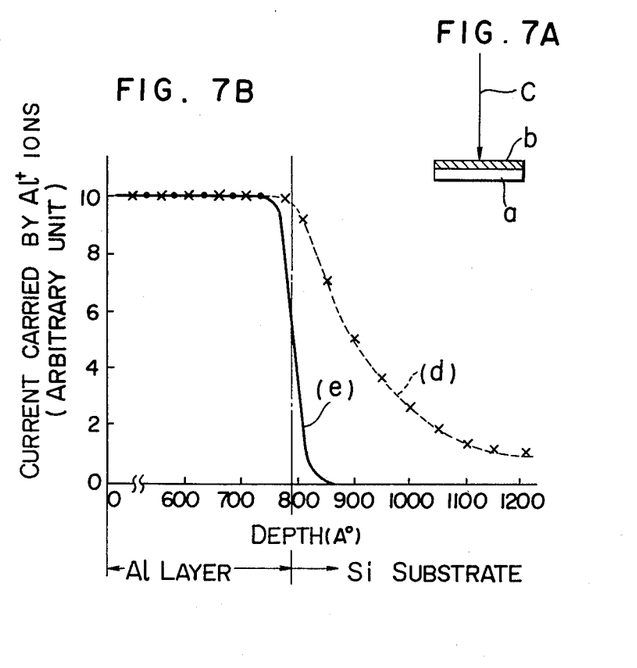
FIG. 7A is a cross section of a sample used in the experiment to compare the present analyzer with the conventional one.
FIGs. 7B and 8 are the graphical representations of the results of comparison between the present analyzer and the conventional one.

FIG. 7A is a cross section of a sample used in the experiment to compare the embodiment of the present invention shown in FIG. 4 with the conventional analyzer and FIG. 7B shows the result of the comparative experiment. In FIG. 7A, a sample consists of a silicon substrate $a$ and an aluminum layer $b$ having a thickness of about 800 A, vapor-deposited on the substrate $a$. The primary ion beam $c$ impinges upon the sample.

Throughout the following experiments argon ions are used as the primary ions. The experimental conditions now maintained are as follows. The acceleration voltage for the primary ion beamis 10 KV, the current carried by the primary ion beam is 10 microamperes, the spot diameter of the primary ion beam is 2 mm, the voltage at the intermediate electrode of the modified electrostatic lens is 1 KV, the dimensions of the β-slit aperture are 0.5 mm × 0.5 mm, and the size of the secondary ion image on the β-slit is 2 mm x × mm. Under these conditions, the mass spectrometer is adjusted to detect aluminum ions (hereafter referred to as $Al^+$ for brevity) and the variation with time of the current of $Al^+$ is recorded by a recorder. In the diagram in FIG. 7B, the broken curve $d$ is the plotting of the data obtained by the conventional analyzer and the solid curve $e$ corresponds to the data obtained by the present analyzer. As apparent from FIG. 7B, with the conventional apparatus (broken curve $d$ ), 10 to 20% of $Al^+$ current still remains even where the depth of the sputtering of the sample by the primary ion beam exceeds 800 A. On the other hand, with the apparatus according to the present invention, the $Al^+$ current rapidly falls at the depth of 800 A and vanishes at the depth of about 850 A (slid curve $e$). The experimental data described above were obtained by the IMA using projection type ion beam bombardment and it is clear in this case that the analytic accuracy in the direction of the depth is much improved.

Figure 8:
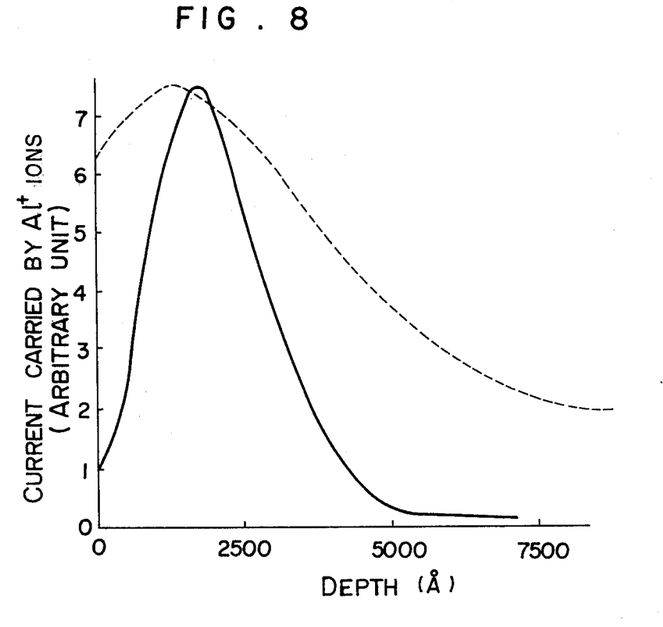

FIG. 8 shows the result of the experiment conducted to compare the conventional analyzer with the one using scanning type ion bombardment method, according to the present invention. The experimental conditions maintained are as follows. The accelerating voltage for the primary ion beam is 10 KV, the current carried by the primary ion beam is 2 microamperes, the spot diameter of the primary ion beam is 10 microns, the voltage at the intermediate electrode of the modified electrostatic lens is 1 KV, the size of the β-slit aperture is 0.5 mm × 0.5 mm, and the size of the secondary ion image on the β-slit is 2 mm × 2 mm. A highly refined silicon substrate with $Al^+$ implanted under high voltage, is used as a sample. It is theoretically proved that in the process of implanting metal ions such as aluminum ions into silicon the concentration of the implanted aluminum ions in the direction of the depth of the silicon is not uniform but in the Gaussian distribution. In order to verify the theory and to make comparison between the conventional IMA and the presently proposed one, the above mentioned sample is used. Now, the result of the experiment will be described. The intensity of the magnetic field in the mass spectrometer is adjusted for $Al^+$ having mass number 27 and the variation with time of the $Al^+$ current is recorded by a recorder. As apparent from the broken curve $f$ in FIG. 8 which is associated with the conventional apparatus, the concentration of the implanted aluminum ions is high in the surface of the sample and decreases as the sputtering goes on to increase the depth of etching. It should be noted, in this case, that an appreciable amount of $Al^+$ remains and the amount is almost kept constant even when the etching advances to a sufficient depth. On the other hand, according to the solid curve $g$ in FIG. 8 which corresponds to the apparatus of the present invention, the concentration is sufficiently low near the surface of the sample, reaches its peak at the depth of about 2500 A, rapidly falls thereafter, and is reduced almost to zero at depths in excess of about 5000 A. It has been, therefore, proved experimentally that the concentration of the aluminum ions implanted into silicon is in the Gaussian distribution and, at the same time, that a high analytic accuracy in the direction of the depth is attained which could not be obtained with the conventional apparatus. Further, it is seen from the result of the experiment that the analytic accuracy in the direction of the depth obtained with the present apparatus is higher by more than one order, than that obtained by the conventional apparatus and that the utility factor of the secondary ions with the present apparatus is about ten times as high as that with the conventional one. These meritorious features of the present invention can be obtained due only to the replacement of an ordinary electrostatic lens by a modified one, that is, the simple modification of structure, so that the secondary ion image may be formed on the β-slit. Thus, the present invention may be claimed to have a great practical value.

Numerous changes and modifications other than those described in the specification and shown in the attached drawings will be easily thought of by those skilled in the art, without departing from the spirit of the present invention. For example, the modified electrostatic lens, which has a rectangular aperture in the embodiment described above, may have an elliptic aperture. Therefore, it should be appreciated that the present invention is by no means limited to those embodiments and the embodiments are introduced only to help the better understanding of the invention.

I claim:

1. An ion microanalyzer comprising means for emitting primary ions, means for bombarding a sample with the primary ions to thereby emit secondary ions from said sample, first means for dispersing the secondary ions in accordance with their mass to electric charge ratios, means for detecting the secondary ions dispersed by said first dispersing means, and means for focusing the secondary ions in a direction perpendicular to that of the dispersion of the secondary ions more than in other directions into a predetermined position between said sample and said detecting means to thereby form an image of the secondary ions emitted from said sample on the predetermined position.

2. An ion microanalyzer according to claim 1, wherein said focusing means comprises an electrostatic lens.

3. An ion microanalyzer according to claim 2, further comprising a slit disposed in the predetermined position between said first dispersing means and said detecting means, said electrostatic lens being disposed between said sample and said first dispersing means.

4. An ion microanalyzer according to claim 3, wherein said first dispersing means comprises means for producing a sector-shaped magnetic field.

5. An ion microanalyzer according to claim 3, wherein said electrostatic lens is provided with a rectangular aperture having a cross section which exhibits small and large dimensions, the large dimension thereof being coincident with that of the dispersion of the secondary ions due to said first dispersing means.

6. An ion microanalyzer according to claim 3, wherein said electrostatic lens is provided with a rectangular aperture having a cross section which exhibits horizontal and vertical directions, the vertical direction thereof being coincident with that of the dispersion of the secondary ions due to said first dispersing means.

7. An ion microanalyzer according to claim 6, wherein said slit has an aperture of circular shape.

8. An ion microanalyzer according to claim 6, wherein said slit has an aperture of regular polygonal shape.

9. An ion microanalyzer according to claim 2, further comprising second means disposed between said sample and said first dispersing means for dispersing the secondary ions in accordance with their energy levels, and a slit disposed in the predetermined position between said first and second dispersing means, said electrostatic lens being disposed between said sample and said second dispersing means.

10. An ion microanalyzer according to claim 9, wherein said electrostatic lens is provided with a rectangular aperture having a cross section which exhibits small and large dimensions, the large dimension thereof being coincident with that of the dispersion of the secondary ions due to the second dispersing means.

11. An ion microanalyzer according to claim 9, wherein said electrostatic lens is provided with a rectangular aperture having a cross section which exhibits horizontal and vertical directions, the vertical direction thereof being coincident with that of the dispersion of the secondary ions due to said second dispersing means.

12. An ion microanalyzer according to claim 11, wherein said slit has an aperture of circular shape.

13. An ion microanalyzer according to claim 11, wherein said slit has an aperture of regular polygonal shape.

14. An ion microanalyzer according to claim 9, wherein said first dispersing means comprises means for producing a sector-shaped magnetic field.

15. An ion microanalyzer according to claim 14, wherein said electrostatic lens is provided with a rectangular aperture having a cross section which exhibits horizontal and vertical directions, the vertical direction thereof being coincident with that of the dispersion of the secondary ions due to said second dispersing means, and wherein said slit is provided with an aperture of circular shape.

16. An ion microanalyzer according to claim 14, wherein said electrostatic lens is provided with a rectangular aperture having a cross section which exhibits small and large dimensions, the large dimension thereof being coincident with that of the dispersion of the secondary ions due to said second dispersing means, and wherein said slit is provided with an aperture of circular shape.

17. An ion microanalyzer according to claim 14, wherein said electrostatic lens is provided with a rectangular aperture having a cross section which exhibits horizontal and vertical directions, the vertical direction thereof being coincident with that of the dispersion of the secondary ions due to said second dispersing means, and wherein said slit is provided with an aperture of regular polygonal shape.

18. An ion microanalyzer according to claim 14, wherein said electrostatic lens is provided with a rectangular aperture having a cross section which exhibits small and large dimensions, the large dimension thereof being coincident with that of the dispersion of the secondary ions due to said second dispersing means, and wherein said slit is provided with an aperture of regular polygonal shape.

* * * * *